US010349538B1

(12) United States Patent
Hsu et al.

(10) Patent No.: US 10,349,538 B1
(45) Date of Patent: Jul. 9, 2019

(54) FIXING STRUCTURE AND NECK STRAP HAVING THE SAME

(71) Applicant: Merry Electronics(Shenzhen) Co., Ltd., ShenZhen (CN)

(72) Inventors: Yung-Tsung Hsu, Taichung (TW); I-Chang Liu, Taichung (TW); Chien-Min Yao, Taichung (TW)

(73) Assignee: Merry Electronics(Shenzhen) Co., Ltd., ShenZhen (CN)

( * ) Notice: Subject to any disclaimer, the term of this patent is extended or adjusted under 35 U.S.C. 154(b) by 0 days.

(21) Appl. No.: 16/111,229

(22) Filed: Aug. 24, 2018

(51) Int. Cl.

*H04R 25/00* (2006.01)
*H05K 5/00* (2006.01)
*H05K 1/02* (2006.01)
*H04R 1/10* (2006.01)

(52) U.S. Cl.

CPC .......... *H05K 5/0052* (2013.01); *H05K 1/028* (2013.01); *H05K 5/0039* (2013.01); *H05K 5/0056* (2013.01); *H04R 1/105* (2013.01)

(58) Field of Classification Search

CPC combination set(s) only.
See application file for complete search history.

(56) References Cited

U.S. PATENT DOCUMENTS 7,614,911 B2 * 11/2009 Hsieh ................ H01R 13/5845 174/135
9,002,026 B2 * 4/2015 Lin ..................... H04R 1/1008 381/370
9,143,848 B2 * 9/2015 Hebenstreit ............ H04R 1/028
9,247,353 B2 * 1/2016 Bewley ................ H04R 25/556
9,554,206 B2 * 1/2017 Fujise ................. H04R 1/2888
2009/0104945 A1 * 4/2009 Axelsson ................. H01B 7/40 455/569.1
2009/0253996 A1 * 10/2009 Lee ...................... A61B 5/0476 600/544
2013/0089229 A1 * 4/2013 Kristo .................. H04R 25/606 381/326
2013/0329905 A1 * 12/2013 Awiszus ............... H04R 1/1058 381/74
2014/0047616 A1 * 2/2014 Lee ........................ A42B 1/245 2/209.13
2015/0289047 A1 * 10/2015 Greig ................... H04R 5/0335 381/74
2018/0070179 A1 * 3/2018 McAuliffe ............... H01Q 1/38

* cited by examiner

*Primary Examiner* — William H. Mayo, III
*Assistant Examiner* — Krystal Robinson
(74) *Attorney, Agent, or Firm* — JCIPRNET

(57) ABSTRACT

A neck strap including at least one flexible circuit board, at least two fixing structures, a positioning element, a protecting layer, and a supporting element is provided. The at least two fixing structures are disposed on two opposite ends of the at least one flexible circuit board and has a housing. The positioning element is disposed in the housing and a through groove is formed between the housing and the positioning element. The protecting layer is at least partially sleeved around the positioning element, the at least one flexible circuit board, and the at least two fixing structures. The supporting element is disposed through the positioning element.

11 Claims, 9 Drawing Sheets

141(140)
P
120
130
140
G
150
SA
LA
111
110
100

FIXING STRUCTURE AND NECK STRAP HAVING THE SAME

CROSS-REFERENCE TO RELATED APPLICATION

This application claims the priority benefit of Taiwan application serial no. 107118566, filed on May 30, 2018. The entirety of the above-mentioned patent application is hereby incorporated by reference herein and made a part of this specification.

BACKGROUND

Technical Field

The disclosure relates to a fixing structure and a neck strap having the same, and particularly relates to a neck strap whose volume may be reduced.

Description of Related Art

Regarding the wire material of a headphone neck strap or other electronic products on the current market, mostly in a rubber layer are embedded multiple sets of core wires (such as single-core wires or multi-core wires), and it is thus necessary to ensure that the sets of core wires are not in contact with one another and are not conductive therebetween so as to prevent the problem of current short circuit. The current practice is to encapsulate the periphery of each set of core wires with an additional insulating material. However, the conventional method of encapsulating core wires has the following disadvantages: 1. When the number of core wires is large, the volume of the wire material increases. As a result, the cable management space inside the electronic product becomes insufficient and thus affects the assembly, and it is even necessary to modify the appearance of the electronic product in order to accommodate the wire material. 2. The core wires are required to be coupled to the electronic product through a welding method. However, the welding method has the disadvantages of long working hours and high rework probability.

SUMMARY

The disclosure provides a fixing structure and a neck strap having the same, wherein the volume is decreased, work hours are saved, and rework probability is reduced.

A fixing structure of a neck strap in this disclosure includes a housing and a through groove. The housing has an inner space, and a positioning element is disposed in the inner space of the housing. The through groove is formed in the inner space. Herein the through groove is formed between the positioning element and the housing for at least one flexible circuit board to penetrate through.

In an embodiment of the disclosure, the housing includes an upper cover and a lower cover, the upper cover and the lower cover are engaged with each other, and the through groove is formed between the positioning element and the lower cover.

In an embodiment of the disclosure, the positioning element has a perforation for a supporting element to penetrate through, and the supporting element is suspended inside the housing so that the supporting element is spaced apart from the at least one flexible circuit board.

In an embodiment of the disclosure, the supporting element includes a memory metal.

In an embodiment of the disclosure, the positioning element is made of a nylon material.

In an embodiment of the disclosure, a radial cross-section of the through groove has a length extending toward two sides of the housing, and has a width extending toward two ends of the housing. Herein the length is greater than the width.

A neck strap in this disclosure includes at least one flexible circuit board, at least two fixing structures, a positioning element, a protecting layer, and a supporting element. The at least two fixing structures are disposed on two opposite ends of the at least one flexible circuit board. Each of the at least two fixing structures includes a housing and a through groove. The housing has an inner space, and the through groove is formed in the inner space for the at least one flexible circuit board to penetrate through. The positioning element is disposed in the inner space of the housing, wherein the positioning element and the through groove are disposed in parallel. The protecting layer is at least partially sleeved around the positioning element, the at least one flexible circuit board, and the at least two fixing structures. The supporting element is disposed through the positioning element.

In an embodiment of the disclosure, the housing includes an upper cover and a lower cover, the upper cover and the lower cover are engaged with each other, the through groove is formed between the positioning element and the lower cover, and the protecting layer covers opposite outer sides of the upper cover and the lower cover.

In an embodiment of the disclosure, the positioning element has a perforation for a supporting element to penetrate through, and the supporting element is suspended inside the housing so that the supporting element is spaced apart from the at least one flexible circuit board.

In an embodiment of the disclosure, the protecting layer is made of a rubber material, and is fabricated through a hot pressing process and a low temperature vulcanization process.

Based on the foregoing, the neck strap in this disclosure, at least one flexible circuit board is adopted to replace the conventional core wire. Since the flexible circuit board has the characteristic of thinness and only requires small space, the overall volume of the neck strap is greatly reduced. Therefore, when the neck strap is installed inside the electronic product, the appearance and the cable management space of the electronic product are not affected. In addition, a plug-in coupling method may be used for the flexible circuit board without the need to adopt the conventional welding method of the wire material. As a result, work hours are saved, and rework probability is reduced.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
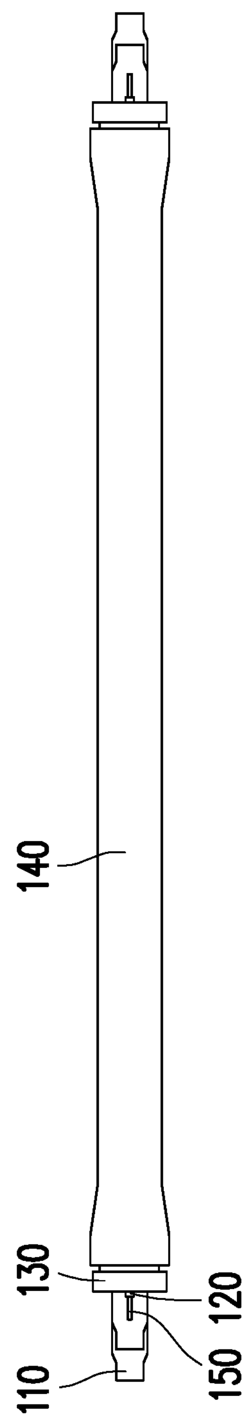
FIG. 1A is a schematic top view illustrating a neck strap according to an embodiment of the disclosure.
Figure 1B:
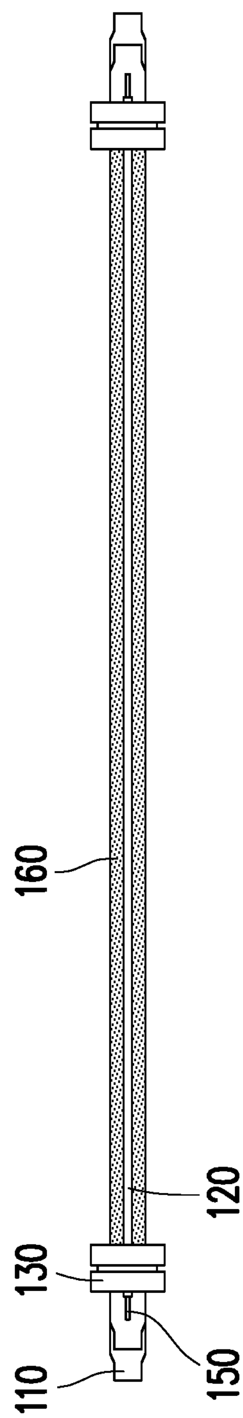
FIG. 1B is a schematic three-dimensional view illustrating the neck strap of FIG. 1A with the protecting layer removed.
Figure 1C:
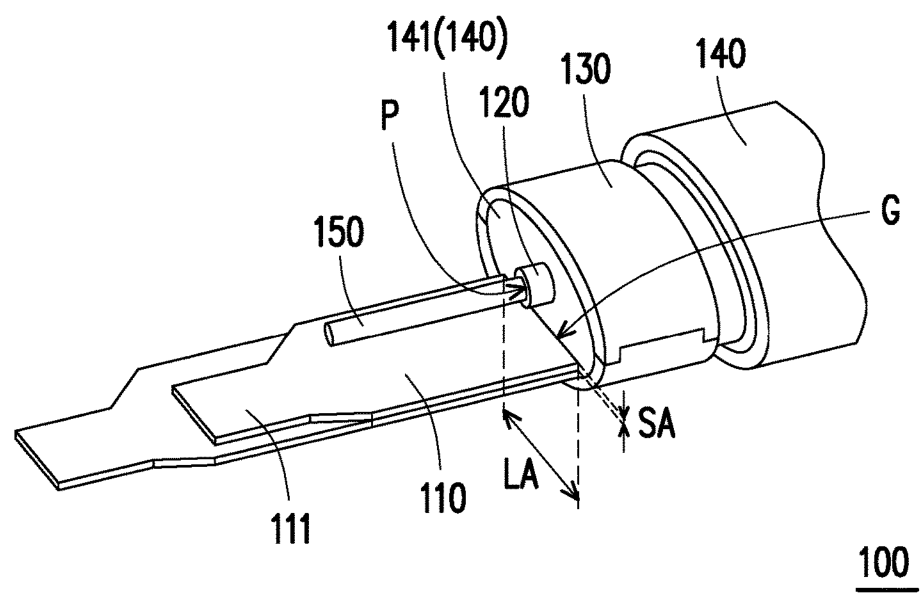
FIG. 1C is a schematic view illustrating assembly of the components of the neck strap of FIG. 1A.
Figure 1D:
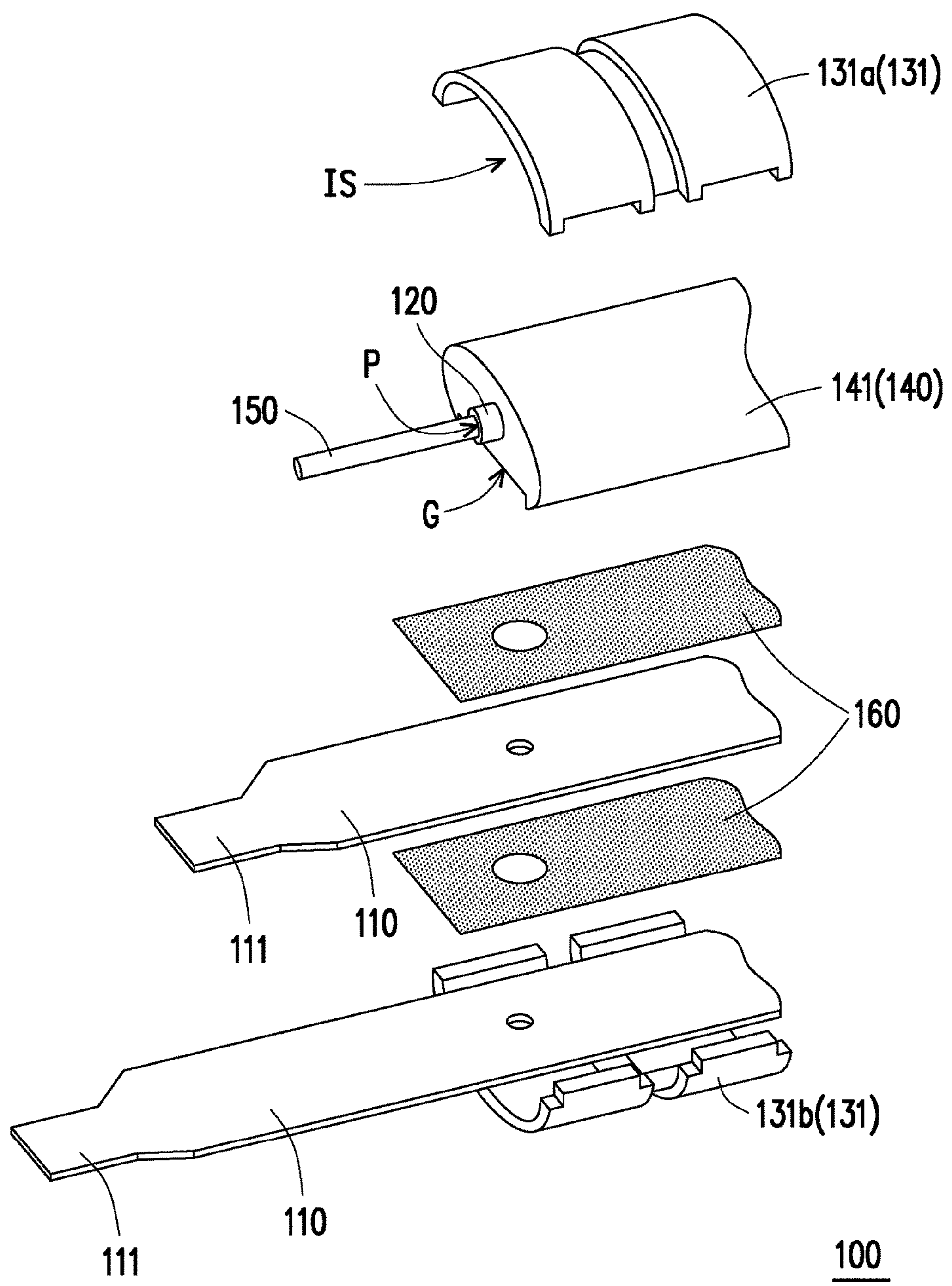
FIG. 1D is a schematic exploded view of the components of the neck strap of FIG. 1C.
Figure 1E:
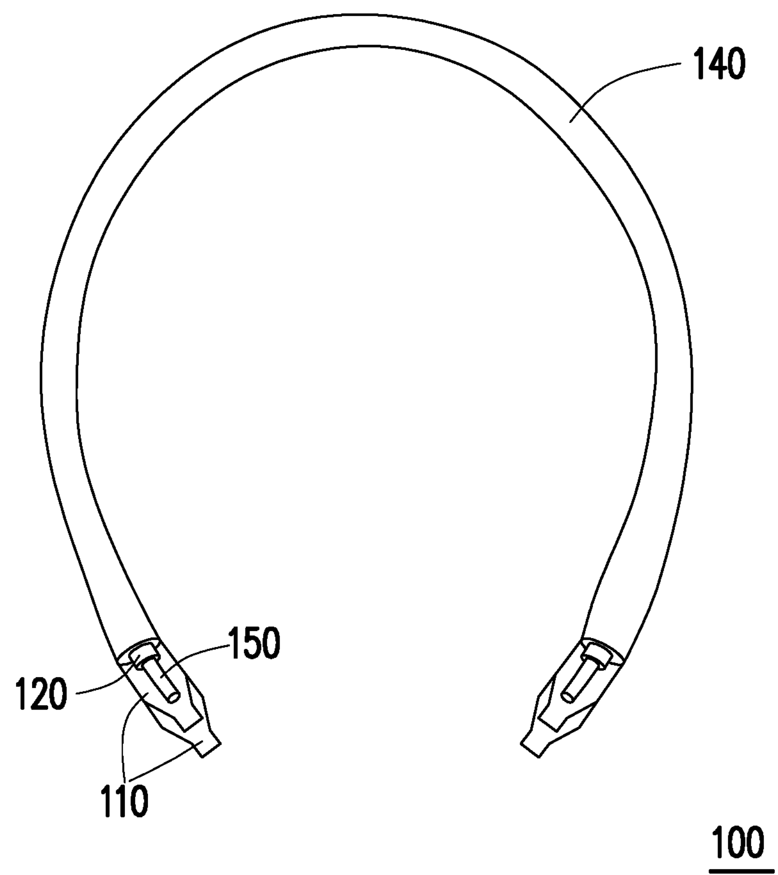
FIG. 1E is a schematic view illustrating deformation of the neck strap of FIG. 1A.

FIG. 1A is a schematic top view illustrating a neck strap according to an embodiment of the disclosure. FIG. 1B is a schematic three-dimensional view illustrating the neck strap of FIG. 1A with the protecting layer removed. FIG. 1C is a schematic view illustrating assembly of the components of the neck strap of FIG. 1A. FIG. 1D is a schematic exploded view of the components of the neck strap of FIG. 1C. FIG. 1E is a schematic view illustrating deformation of the neck strap of FIG. 1A.

With reference to FIG. 1A to FIG. 1C, a neck strap 100 of this disclosure is adapted to be disposed in a neck-hanging structure of a headphone or in other types of electronic products and to serve as a transmission path of an electrical signal. The neck strap 100 includes at least one flexible circuit board 110, a plurality of fixing structures 130, a positioning element 120, a protecting layer 140, and a supporting element 150. The flexible circuit board 110 is made of a flexible material such as a polyimide (PI) to serve as a substrate, and has characteristics such as light weight, thin thickness, flexibility and bendability. Moreover, a desired circuit pattern of the flexible circuit board 110 is formed from a copper foil on the substrate through a lithographic process and an etching process, thereby facilitating miniaturization of the neck strap 100. In this embodiment, reference is also made to FIG. 1C and FIG. 1D. The plurality of fixing structures 130 (two in FIG. 1A) are respectively disposed on two opposite ends of the at least one flexible circuit board 110.

In brief, two fixing structures 130 are adjacent to two ends of the at least one flexible circuit board 110. Each of the fixing structures 130 includes a housing 131 and a through groove G. The housing 131 has an inner space IS. Specifically, the housing 131 includes an upper cover 131*a* and a lower cover 131*b*, and the upper cover 131*a* and the lower cover 131*b* are engaged with each other and hold the at least one flexible circuit board 110. The positioning element 120 is disposed in the inner space IS of the housing 131. Herein the positioning element 120, the through groove G, and the at least one flexible circuit board 110 are disposed in parallel, and the through groove G is formed between the positioning element 120 and the housing 131. In this embodiment, the positioning element 120 is spaced apart from the at least one flexible circuit board 110 in parallel. Specifically, the positioning element 120, for example, is made of a fiber material or a nylon material so as to have characteristics of good resistance to high temperature and good bendability. In other embodiments, depending on process and structural requirements, the positioning element may also be attached on the at least one flexible circuit board in parallel.

Furthermore, a radial cross-section of the through groove G has a length LA extending toward two sides of the housing, and has a width SA extending toward two ends of the housing. Herein the length LA is greater than the width SA.

With reference to FIG. 1D and FIG. 1E, in this embodiment, the positioning element 120 is disposed through two fixing structures 130. The through groove G is formed between the positioning element 120 and two lower covers 131*b* for the at least one flexible circuit board 110 to penetrate through and to be positioned inside the housing 131. The positioning element 120 has a perforation P so as to have a guiding effect. Besides, the positioning element 120 in this embodiment, for example, is made of a fiber material or a nylon material so as to have characteristics of good resistance to high temperature and good bendability.

The protecting layer 140 is disposed outside the fixing structure 130 and covers a portion of the upper cover 131*a* and a portion of the lower cover 131*b*. The protecting layer 140 is at least partially sleeved around two housings 131 of the two fixing structures 130, the positioning element 120, and the at least one flexible circuit board 110. Herein the two ends of the at least one flexible circuit board 110 protrude out of the plurality of fixing structures 130 and the protecting layer 140 respectively. Specifically, a gap exists between the protecting layer 140 and the at least one flexible circuit board 110. In addition, the protecting layer 140, for example, is made of a rubber material so as to have a characteristic of good bendability, and is fabricated through a hot pressing process and a low temperature vulcanization process. After the hot pressing process is performed, the protecting layer 140 may be closely adhered to the plurality of fixing structures 130, the positioning element 120 and the at least one flexible circuit board 110.

Moreover, the protecting layer 140 further includes a plurality of fixing blocks 141 filled in the internal space IS of each housing 131. Each of the fixing blocks 141 is configured to partially cover the positioning element 120, and is connected to the upper cover 131*a* and the lower cover 131*b* of the housing 131. In addition, the fixing block 141 is made of a rubber material, for example, and is fabricated through a hot pressing process and a low temperature vulcanization process. In short, the fixing block 141 is configured to position the at least one flexible circuit board 110 and the positioning element 120 inside the housing 131 of each fixing structure 130.

The supporting element 150 is disposed through the perforation P of the positioning element 120 so that the supporting element 150 is guided to be disposed through the positioning element 120. The supporting element 150 is suspended inside the housing 131 so that the supporting element 150 is spaced apart from the at least one flexible circuit board 110. In addition, the supporting element 150 is, for example, a memory metal. The memory metal is an alloy material that undergoes deformations at lower temperature but returns to the pre-deformed original shape after being heated up. In this embodiment, the memory metal may be freely bent at a certain temperature (for example, at normal temperature) so as to cause deformations of the at least one flexible circuit board 110, the positioning element 120 and the protecting layer 140, just like the curved shape as shown in FIG. 1E or other specific shapes.

Furthermore, since the supporting element 150 is suspended inside the housing 131, when the supporting element 150 is disposed through the perforation P of the positioning element 120 and is bent, it is relatively easy to cause the corresponding deformations of the flexible circuit board 110, the supporting element 150, and the protecting layer 140.

In this embodiment, the number of the at least one flexible circuit board 110 is two. In other embodiments, the number of the at least one flexible circuit board may also be more. The number may be increased or decreased depending on functional requirements of the electronic product. The two flexible circuit boards 110 are respectively used for transmitting different electrical signals. The neck strap 100 includes two adhesive layers 160 respectively disposed on the two flexible circuit boards 110 corresponding thereto. The two flexible circuit boards 110 are stacked on each other, and are integrally connected to each other through one of the adhesive layers 160. Moreover, the two ends of each flexible circuit boards 110 respectively include two plug-in parts 111. Each plug-in part 111 protrudes out of the corresponding fixing structure 130 so that the plug-in part 111 is adapted to be electrically coupled to a corresponding electronic connector or electronic slot of an external electronic product.

A method of manufacturing a neck strap of this disclosure is explicated below. FIG. 2A to FIG. 2H are schematic views showing a manufacturing method of the neck strap of FIG. 1A.

Figure 2A:
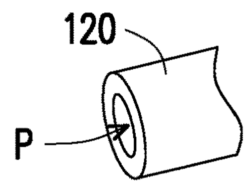
FIG. 2A to FIG. 2H are schematic views illustrating a manufacturing method of the neck strap of FIG. 1A.
Figure 2B:
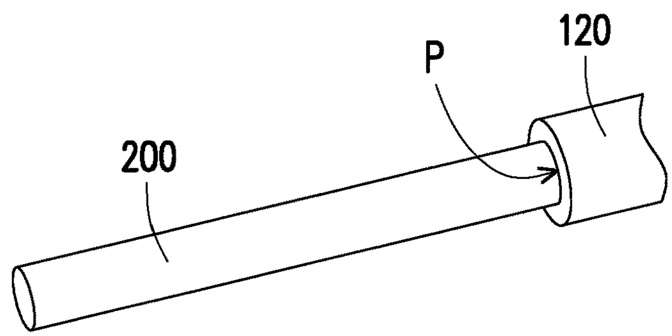
Figure 2C:
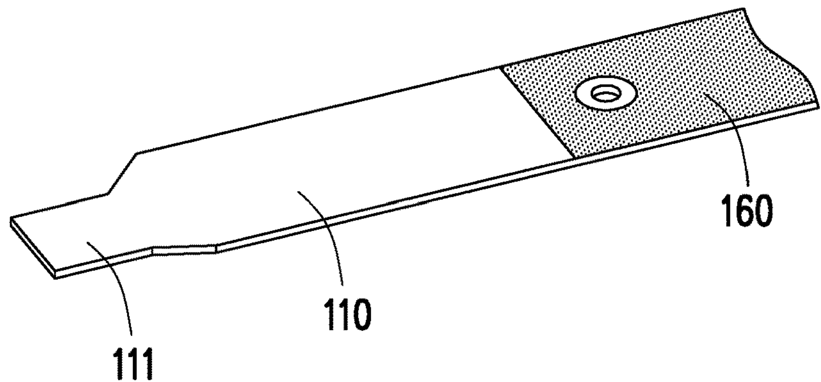
Figure 2D:
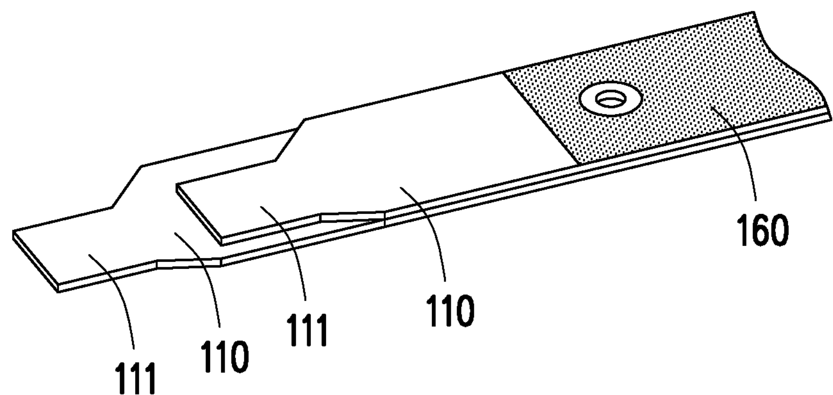
Figure 2E:
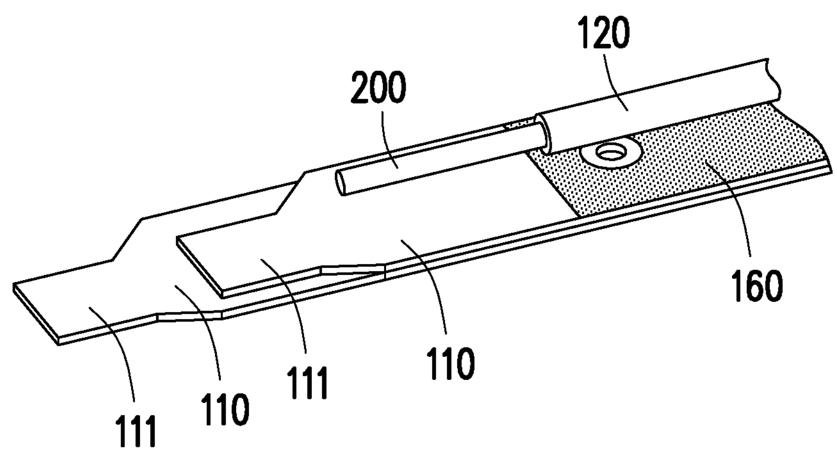

With reference to FIG. 2A and FIG. 2B, the positioning element 120 is made using a fiber material or a nylon material, and an auxiliary element 200 is inserted through the positioning element 120. The two flexible circuit boards 110 are made by performing a lithographic process and an etching process. With reference to FIG. 2C, the first adhesive layer 160 is attached on one of the flexible circuit boards 110. With reference to FIG. 2D, the other flexible circuit board 110 is disposed on the first adhesive layer 160 so that the two flexible circuit boards 110 are stacked on each other and connected to each other, and the second adhesive layer 160 is attached to the other flexible circuit board 110. With reference to FIG. 2E, the positioning element 120 that has the auxiliary element 200 inserted therethrough is disposed in parallel above the other flexible circuit board 110. Alternatively, the positioning element 120 that has the auxiliary element 200 inserted therethrough may be directly attached on the second adhesive layer 160 to be connected to the other flexible circuit board 110.

Figure 2F:
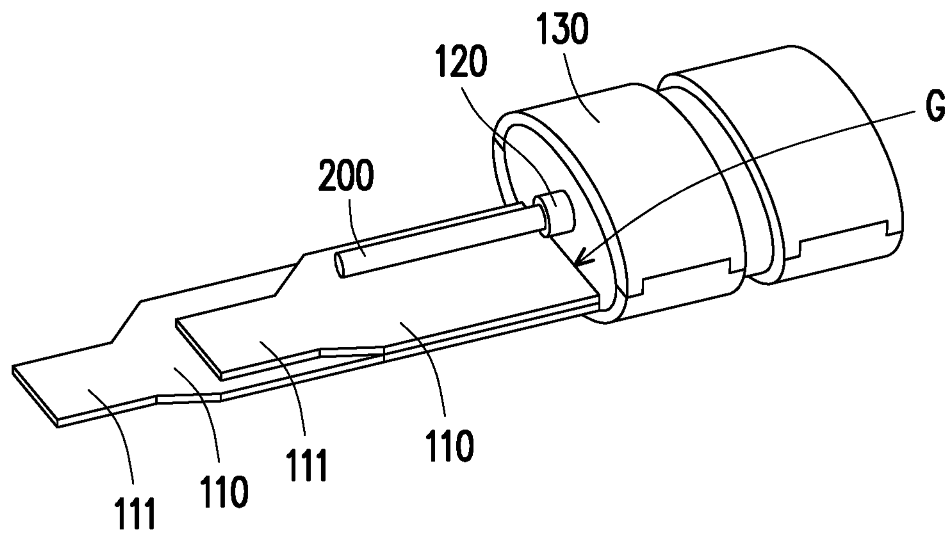

Then, with reference to FIG. 2F and FIGS. 1B and 1D, the plurality of fixing structures 130 are respectively disposed outside the positioning element 120 and the two flexible circuit boards 110 for accommodating and positioning two opposite ends of the positioning element 120 and the two flexible circuit boards 110. Specifically, the upper cover 131*a* and the lower cover 131*b* of each fixing structure 130 are engaged with each other and form the inner space IS for the flexible circuit board 110 and the positioning element 120 to penetrate through and be accommodated therein.

Figure 2G:
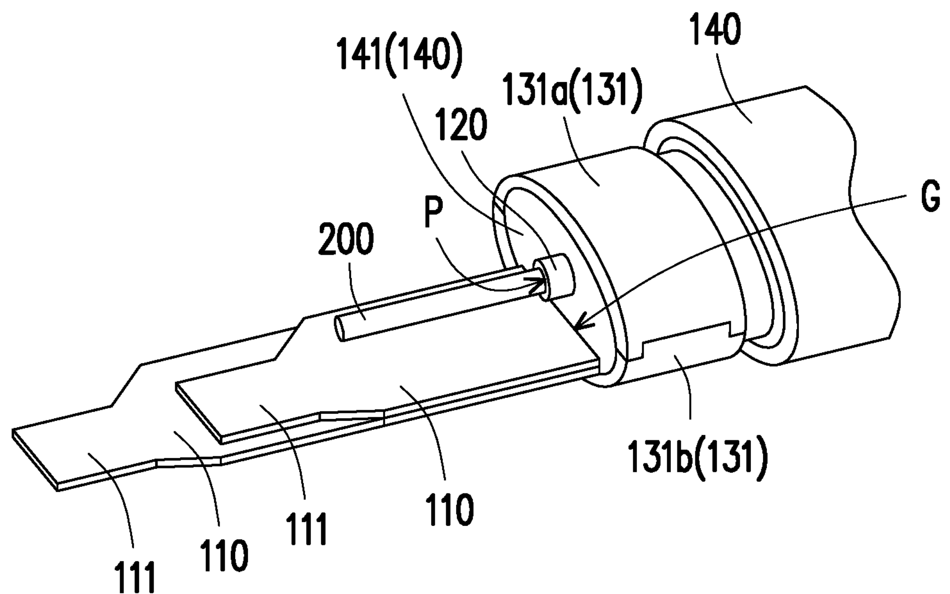

With reference to FIG. 2G, a rubber fabricated by a low temperature vulcanization process is disposed outside the plurality of fixing structures 130 to serve as the protecting layer 140, and is at least partially sleeved around the positioning element 120, the two flexible circuit board 110 and each fixing structure 130. At the same time, the fixing block 141 of the protecting layer 140 is filled in the internal space IS of the housing 131, and is connected the upper cover 131*a* and the lower cover 131*b* of the housing 131. The fixing block 141 is used for partially covering the positioning element 120 and each flexible circuit board 110. Herein the two ends of the auxiliary element 200 protrude out of the protecting layer 140, the two ends of each flexible circuit board 110 respectively protrude out of the plurality of fixing structures 130, and the auxiliary element 200 is used to prevent the deformations of the positioning element 120, the two flexible circuit boards 110 and the protecting layer 140. Specifically, the positioning element 120, the two flexible circuit boards 110 and the protecting layer 140 are maintained in a straight appearance by support of the rigidity of the auxiliary element 200.

With reference to FIG. 2G, the neck strap 100 provided with the auxiliary element 200 is fed into an external heating mold for a hot pressing process. The two ends of the auxiliary element 200 are used for fixing the neck strap 100 in the heating mold to prevent the neck strap 100 from shifting away. By means of the heating mold, the protecting layer 140 is hot-pressed and deformed by heat so as to be closely adhered to the plurality of fixing structures 130, the positioning element 120 and the two flexible circuit boards 110.

Figure 2H:
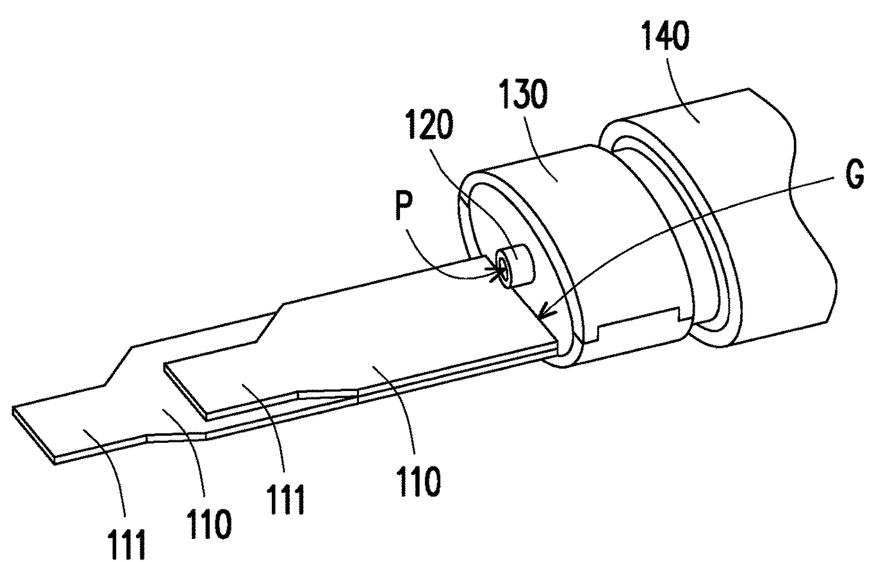

With reference to FIG. 2H and FIG. 2A, after the auxiliary element 200 is extracted from inside the positioning element 120, the positioning element 120 then has the perforation P. At this time, the neck strap 100 may be bent and deformed freely. With reference to FIG. 1C and FIG. 1E, the supporting element 150 such as a memory metal is disposed through the perforation P of the positioning element 120 so that the supporting element 150 is guided to be inserted through the positioning element 120, and the two ends of the supporting element 150 respectively protrude out of the plurality of fixing structures 130. Furthermore, an external force is applied to the supporting element 150 so that the neck strap 100 is bent to present a neck-hanging shape, and is adapted for a neck-hanging headphone. At this point, the fabrication of the neck strap 100 is basically completed. In other embodiments, the memory metal may be bent and deformed into a round shape, a square shape or any other shape at normal temperature so that the neck strap is adapted for various types of electronic products.

In summary, in the neck strap in this disclosure, at least one flexible circuit board is adopted to replace the conventional core wire. Since the flexible circuit board has the characteristic of thinness and only requires small space, the overall volume of the neck strap is greatly reduced. Therefore, when the neck strap is installed inside the electronic product, the appearance and the cable management space of the electronic product are not affected. In addition, a plug-in coupling method may be used for the flexible circuit board without the need to adopt the conventional welding method of core wires. As a result, work hours are saved, and rework probability is reduced.

Furthermore, the neck strap of this disclosure includes the positioning element for accommodating, guiding and disposing the memory metal. As a result, the neck strap may be freely bent to be transformed into the desired appearance at a specific temperature, thereby suitable to be used in different electronic products.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fixing structure of a neck strap, comprising:

a housing having an inner space, wherein a positioning element is disposed in the inner space of the housing;

a through groove formed in the inner space;

wherein the through groove is formed between the positioning element and the housing for at least one flexible circuit board to penetrate through, and the positioning element has a perforation for a supporting element to penetrate through, and the supporting element is suspended inside the housing so that the supporting element is spaced apart from the at least one flexible circuit board.

2. The fixing structure of the neck strap as recited in claim 1, wherein the housing comprises an upper cover and a lower cover, the upper cover and the lower cover are engaged with each other, and the through groove is formed between the positioning element and the lower cover.

3. The fixing structure of the neck strap as recited in claim 1, wherein the supporting element comprises a memory metal.

4. The fixing structure of the neck strap as recited in claim 1, wherein the positioning element is made of a nylon material.

5. The fixing structure of the neck strap as recited in claim 1, wherein a radial cross-section of the through groove has a length extending toward two sides of the housing, and has a width extending toward two ends of the housing, wherein the length is greater than the width.

6. A neck strap, comprising:

at least one flexible circuit board;

at least two fixing structures disposed on two opposite ends of the at least one flexible circuit board, each of the at least two fixing structures comprising:

a housing having an inner space; and a through groove formed in the inner space for the at least one flexible circuit board to penetrate through;

a positioning element disposed in the inner space of the housing, wherein the positioning element and the through groove are disposed in parallel;

a protecting layer at least partially sleeved around the positioning element, the at least one flexible circuit board, and the at least two fixing structures; and a supporting element disposed through the positioning element;

wherein, the positioning element has a perforation for the supporting element to penetrate through, and the supporting element is suspended inside the housing so that the supporting element is spaced apart from the at least one flexible circuit board.

7. The neck strap as recited in claim 6, wherein the supporting element comprises a memory metal.

8. The neck strap as recited in claim 6, wherein the housing comprises an upper cover and a lower cover, the upper cover and the lower cover are engaged with each other, the through groove is formed between the positioning element and the lower cover, and the protecting layer covers opposite outer sides of the upper cover and the lower cover.

9. The neck strap as recited in claim 6, wherein the protecting layer is made of a rubber material, and is fabricated through a hot pressing process and a low temperature vulcanization process.

10. The neck strap as recited in claim 6, wherein a radial cross-section of the through groove has a length extending toward two sides of the housing, and has a width extending toward two ends of the housing, wherein the length is greater than the width.

11. The neck strap as recited in claim 6, wherein the positioning element is made of a nylon material.

* * * * *